(12) United States Patent
Negoro et al.

(10) Patent No.: US 11,016,044 B2
(45) Date of Patent: May 25, 2021

(54) NUCLEAR SPIN HYPERPOLARIZATION METHOD AND APPARATUS

(71) Applicant: OSAKA UNIVERSITY, Suita (JP)

(72) Inventors: Makoto Negoro, Suita (JP); Masahiro Kitagawa, Suita (JP); Akinori Kagawa, Suita (JP)

(73) Assignee: OSAKA UNIVERSITY, Osaka (JP)

( * ) Notice: Subject to any disclaimer, the term of this patent is extended or adjusted under 35 U.S.C. 154(b) by 0 days.

(21) Appl. No.: 16/641,096

(22) PCT Filed: Aug. 21, 2018

(86) PCT No.: PCT/JP2018/030871
§ 371 (c)(1),
(2) Date: Feb. 21, 2020

(87) PCT Pub. No.: WO2019/039477
PCT Pub. Date: Feb. 28, 2019

(65) Prior Publication Data
US 2020/0191735 A1 Jun. 18, 2020

(30) Foreign Application Priority Data
Aug. 23, 2017 (JP) .............................. JP2017-160289

(51) Int. Cl.
*G01N 24/08* (2006.01)
*G01R 33/28* (2006.01)
(Continued)

(52) U.S. Cl.
CPC ............. *G01N 24/08* (2013.01); *G01N 24/12* (2013.01); *G01R 33/282* (2013.01); *G01R 33/62* (2013.01)

(58) Field of Classification Search
CPC ........ G01N 24/08; G01N 24/12; G01N 24/00; G01R 33/282; G01R 33/62; A61B 5/055
See application file for complete search history.

(56) References Cited

U.S. PATENT DOCUMENTS

| 6,311,086 B1 | 10/2001 | Ardenkjaer-Larsen et al. |
| 7,205,764 B1 | 4/2007 | Anderson et al. |

(Continued)

FOREIGN PATENT DOCUMENTS

| JP | 3682044 B2 | 8/2005 |
| JP | 2017-15443 A | 1/2017 |

(Continued)

OTHER PUBLICATIONS

International Search Report issued in PCT/JP2018/030871 (PCT/ISA/210), dated Oct. 23, 2018.
(Continued)

*Primary Examiner* — Jay Patidar
(74) *Attorney, Agent, or Firm* — Birch, Stewart, Kolasch & Birch, LLP

(57) ABSTRACT

The nuclear spin hyperpolarization method includes the steps of: irradiating a sample, prepared by doping solid benzoic acid derivative with a pentacene derivative, placed in a space where a static magnetic field is formed by a main magnetic field forming unit, with a laser beam from a laser source; following the light irradiation, irradiating the sample with a microwave from a microwave source while applying a sweeping magnetic field; and after repeating the application of sweeping magnetic field, light irradiation and microwave irradiation, dissolving the benzoic acid derivative in the sample. This enables generation of an aqueous solution containing benzoic acid derivative of which nuclear spins are hyperpolarized.

15 Claims, 14 Drawing Sheets

(51) Int. Cl.
*G01R 33/62* (2006.01)
*G01N 24/12* (2006.01)

(56) References Cited

U.S. PATENT DOCUMENTS

| | | | |
|---|---|---|---|
| 7,351,402 | B2 | 4/2008 | Griffin et al. |
| 8,372,654 | B2 * | 2/2013 | Cook ................. G01N 33/5088 436/174 |
| 2002/0058869 | A1 | 5/2002 | Axelsson et al. |
| 2016/0033590 | A1 * | 2/2016 | Eichhorn ............... G01R 33/56 324/318 |
| 2016/0306020 | A1 | 10/2016 | Jannin et al. |
| 2018/0188338 | A1 | 7/2018 | Tateishi et al. |
| 2019/0346527 | A1 * | 11/2019 | Schwartz ............... G01N 24/12 |

FOREIGN PATENT DOCUMENTS

| | | |
|---|---|---|
| WO | WO 02/37132 A1 | 5/2002 |
| WO | WO 2012/096644 A1 | 7/2012 |
| WO | 2014-502730 A | 2/2014 |
| WO | WO 2014/139573 A1 | 9/2014 |
| WO | WO 2016/188557 A1 | 12/2016 |

OTHER PUBLICATIONS

Tateishi et al., "Room temperature hyperpolarization of nuclear spins in bulk", PNAS, vol. 111, No. 21, May 27, 2014, pp. 7527-7530.
Written Opinion of the International Searching Authority issued in PCT/JP2018/030871 (PCT/ISA/237), dated Oct. 23, 2018.
Sitnikov, A. et al., "A Q-band Low Noise GaAs pHEMT MMIC power amplifier for pulse electron spin resonance spectrometer" Review of Scientific Instruments, vol. 88, No. 5, May 18, 2017, 5 pages.
Kagawa et al., "Dynamic Nuclear Polarizatrion Using Photoexcited Triplet Electron", J. Phys. Chem. A. 2018, vol. 122, pp. 9670-9675 (6 pages).
King et al., "Room-temperature in situ nuclear spin hyperpolarization from optically pumped nitrogen vacancy centres in diamond", Nature Communications, Dec. 7, 2015, pp. 1-4 (5 pages).
Negoro et al., "Dissolution Dynamic Nuclear Polarization at Room Temperature Using Photoexcited Triplet Electrons", J. Phys. Chem. A., 2018, vol. 122, pp. 4294-4297 (4 pages).
Tateishi et al., "Dynamic Nuclear Polarization with Photoexcited Triplet Electrons in a Glassy Matrix", Angew. Chem. Int. Ed., 2013, vol. 52, pp. 13307-13310 (4 pages).

* cited by examiner (a)     (b)

NUCLEAR SPIN HYPERPOLARIZATION METHOD AND APPARATUS

TECHNICAL FIELD

The present invention relates to method and apparatus for hyperpolarization of nuclear spins and, more specifically, to method and apparatus for nuclear spin hyperpolarization by using triplet DNP.

BACKGROUND ART

NMR spectroscopy and MRI are indispensable tools in the fields of chemical analysis and medical diagnosis, respectively. Recently, Dynamic Nuclear Polarization (hereinafter, abbreviated as "DNP") is attracting much attention as one solution for enhancement in sensitivities of these tools.

In NMR spectroscopy and in MRI, atomic nuclear spins (hereinafter also simply referred to as nuclear spins) in a substance is precisely controlled in a strong static magnetic field, and based on electromagnetic wave signals (NMR signals) modulated by nuclear spin interactions, abundant information of molecular level is read. While NMR signal sensitivity is proportional to polarization, Zeeman energy of nuclear spins is very low even under a strong magnetic field of a few to several dozen T (tesla) applied by superconducting magnet. The Zeeman energy is smaller by five orders of magnitude than thermal energy at room temperature and, therefore, the ratio of nuclear spins aligned in the direction of the static magnetic field (polarization) is as low as $10^{-5}$ to $10^{-6}$ (0.001 to 0.0001%). Thus, of the resonant nuclear spins, the ratio of nuclear spins that contribute to detection signals is very low. Therefore, in order to improve sensitivity of NMR spectroscopy and MRI, it is essential to enhance nuclear spin polarization. In the present specification, "hyperpolarization" refers to a state in which nuclear spin polarization exceeds polarization at room temperature.

In DNP, a sample is mixed with free radicals as polarizing agents, the sample is cooled to cryogenic temperature, and then irradiated with a microwave, whereby nuclear spin polarization in the sample is enhanced. This leads to increased NMR signals and higher sensitivity of NMR spectroscopy and MRI. DNP is also used in the field of chemical analysis, and applied researches include, by way of example, applications to analysis of minute samples, interfacial analysis of substances and functional and structural analysis of protein. Further, medical application of DNP has been put on practical use, in which a sample highly polarized by DNP is dissolved and injected to a body and its metabolism is imaged to help determine effects of a cancer therapy.

According to the conventional DNP technique of attaining high polarization, unpaired electron spins in radicals added by a small amount to a sample are polarized by a classic process of thermal equilibration and DNP is conducted. Therefore, the polarization of hydrogen nuclear spins cannot theoretically exceed 660 times the polarization at room temperature. In order to attain nuclear spin polarization of a few to several dozen %, DNP has to be conducted under high magnetic field of 3T or higher at a cryogenic temperature close to 1K, necessitating a large and expensive apparatus.

As a solution to this problem, triplet DNP using electron spins of molecules in a photoexcited triplet state as polarizing agents has been known (see Patent Literatures 1 to 3 listed below). Photoexcitation of π conjugate molecules of pentacene, for example, leads to electron spin excitation, part of which makes a transition to the photoexcited triplet state by intersystem crossing. In this state, electron spins spontaneously polarize to several dozen % by quantum process. This phenomenon is independent of the temperature and the magnetic field. Therefore, by using these as polarizing agents, nuclear spin polarization can be enhanced 660 times or higher than the thermal limit of polarization at room temperature.

As regards the samples that can be highly polarized by DNP, only those which are solid and hardly soluble to water, represented by p-Terphenyl, have been known. This hinders application of triplet DNP to chemical analysis or medical analysis. Patent Literature 4 discloses a solution that uses a specific pentacene derivative that is soluble in various solvents.

CITATION LIST

Patent Literature

PTL 1: U.S. Pat. No. 7,205,764
PTL 2: U.S. Pat. No. 7,351,402
PTL 3: Japanese Patent No. 3682044
PTL 4: JP2017-015443A

SUMMARY OF INVENTION

Technical Problem

Other than the method of using a specific pentacene derivative disclosed in Patent Literature 4, it is desired to realize hyperpolarization of larger number of compositions, particularly those compositions which are soluble and harmless to humans.

Conventional triplet DNP, which uses monochromatic laser of 590 nm as a light source, has a problem that a large and expensive laser generating apparatus is indispensable. This problem cannot be solved by the techniques of Patent Literatures 1 to 4.

Therefore, the first object of the present invention is to provide hyperpolarization method and apparatus that can enhance, by triplet DNP, polarization of nuclear spins of larger variety of compositions than the prior art.

The second object of the present invention is to provide a relatively small and inexpensive apparatus for hyperpolarization of nuclear spins.

Solution to Problem

According to a first aspect, the present invention provides a nuclear spin hyperpolarization method, including: a light irradiation step of irradiating a sample, placed in a space where a uniform static magnetic field is formed, with light; and a microwave irradiation step, following the light irradiation step, of irradiating the sample with a microwave while applying a sweeping magnetic field on the sample. The sample is a solid state benzoic acid derivative doped with a pentacene derivative. The method further includes a dissolving step, conducted after repeating the light irradiation step and the microwave irradiation step, of dissolving the benzoic acid derivative in the sample to generate a solution.

Thus, it becomes possible to generate an aqueous solution containing benzoic acid derivative with hyperpolarized nuclear spins.

Preferably, the sample is further doped with a soluble substance soluble in benzoic acid derivative; and at the dissolving step, the benzoic acid derivative and the soluble substance in the sample are dissolved.

Thus, it becomes possible to generate an aqueous solution containing a benzoic acid derivative and a soluble substance with hyperpolarized nuclear spins.

More preferably, at least one substance other than the pentacene derivative in the sample contains at least one of carbon, oxygen and nitrogen isotopes of non-zero nuclear spin.

Thus, it becomes possible to directly transfer the polarization of electron spins to nuclear spins of the isotope of carbon, oxygen or nitrogen in the sample.

More preferably, the nuclear spin hyperpolarization method further includes a nuclear spin polarization step, conducted after repeating the light irradiation step and the microwave irradiation step and before conducting the dissolving step, of transferring polarization of hydrogen nuclear spins of the substance other than the pentacene derivative in the sample to nuclear spins of the isotope by cross-polarization.

Thus, it becomes possible to generate an aqueous solution containing benzoic acid derivative with hyperpolarized isotope nuclear spins. When the sample contains a soluble substance soluble in benzoic acid derivative, it becomes possible to generate an aqueous solution containing a soluble substance with hyperpolarized isotope nuclear spins.

Preferably, at the dissolving step, a substance other than the pentacene derivative in the sample is dissolved by an aqueous solution of a molecule causing weak acid dissociation or a pH adjusting molecule, to generate the solution.

Thus, it becomes possible to easily generate an aqueous solution with hyperpolarized nuclear spins.

More preferably, the nuclear spin hyperpolarization method further includes a resolidification step of solidifying the solution to generate a solid substance; a nuclear spin transferring step of transferring nuclear spin polarization of benzoic acid derivative in the solid substance to nuclear spins of the molecule causing weak acid dissociation or of the pH adjusting molecule by cross-polarization; and a liquefying step, conducted after the nuclear spin transferring step, of liquefying the solid substance.

Thus, it becomes possible to generate an aqueous solution with hyperpolarized nuclear spins of alkali metal or the like contained in the pH adjusting molecule or the weak acid dissociating molecule.

According to a second aspect, the present invention provides a nuclear spin hyperpolarization method, including: a light irradiation step of irradiating a sample, placed in a space where a uniform static magnetic field is formed, with light; and a microwave irradiation step, following the light irradiation step, of irradiating the sample with a microwave while applying a sweeping magnetic field on the sample. The sample is a mixture of benzoic acid derivative and a partner molecule other than the benzoic acid derivative, doped with a pentacene derivative. The nuclear spin hyperpolarization method further includes a dissolving step, conducted after repeating the light irradiation step and the microwave irradiation step, of dissolving the benzoic acid derivative and the partner molecule in the sample to generate a solution.

Thus, it becomes possible to generate an aqueous solution containing the partner molecule other than the benzoic acid derivative, with hyperpolarized nuclear spins.

Preferably, the partner molecule is a carboxylic acid other than the benzoic acid derivative, or a base forming a salt with the benzoic acid derivative, and the mixture is a cocrystalline or eutectic polycrystal sample or an amorphous sample.

Thus, it becomes possible to generate an aqueous solution containing a carboxylic acid other than the benzoic acid derivative or containing a base forming a salt with the benzoic acid derivative, with hyperpolarized nuclear spins.

More preferably, the sample is further doped with a soluble substance soluble in the mixture of the benzoic acid derivative and the partner molecule other than the benzoic acid derivative; and at the dissolving step, the benzoic acid derivative, the partner molecule and the soluble substance in the sample are dissolved.

Thus, it becomes possible to generate an aqueous solution containing benzoic acid derivative and a soluble substance soluble in the mixture of the benzoic acid derivative and the partner molecule other than the benzoic acid derivative, with hyperpolarized nuclear spins.

More preferably, the nuclear spin hyperpolarization method further includes a step of dissolving an object substance as an object of which nuclear spins are to be hyperpolarized, in the solution generated at the dissolving step; a resolidification step of solidifying the solution to which the object substance is dissolved, to generate a solid substance; a target nuclear spin polarization step of transferring nuclear spin polarization of the benzoic acid derivative in the solid substance to nuclear spins of the object substance by spin diffusion; and a liquefying step, conducted after the target nuclear spin polarization step, of liquefying the solid substance.

Thus, it becomes possible to generate an aqueous solution containing an object substance with hyperpolarized nuclear spins.

Preferably, at the resolidification step, the solution to which the object substance is dissolved is frozen to generate the solid substance; and at the liquefying step, the frozen solid substance is heated to be liquefied.

Thus, it becomes possible to easily generate an aqueous solution containing an object substance with hyperpolarized nuclear spins.

More preferably, the object substance is a carboxylic acid compound, a compound having an amino group, sugar, an in vivo molecule or a molecule used as a medicine.

Thus, it becomes possible to generate an aqueous solution containing carboxylic acid compound, a compound having amino group, sugar, an in-vivo molecule, or a molecule used as a medicine (for example, pyruvic acid, fumaric acid, urea, fructose, caffeine, and fluorouracil), with hyperpolarized nuclear spins.

According to a third aspect, the present invention provides a nuclear spin hyperpolarization apparatus for attaining nuclear spin hyperpolarization in a sample by triplet DNP. The nuclear spin hyperpolarization apparatus includes: a magnetic field forming unit forming a static magnetic field; a light irradiation unit irradiating the sample, placed in a space where the static magnetic field is formed, with light; a microwave irradiation unit irradiating the sample, placed in the space where the static magnetic field is formed, with a microwave; and a control unit controlling the light irradiation unit and the microwave irradiation unit. The control unit controls the light irradiation unit and the microwave irradiation unit such that nuclear spins in the sample are hyperpolarized by triplet DNP; and the light irradiation unit outputs non-coherent light of which wavelength is in a range of 400 nm to 600 nm.

Thus, it becomes possible to realize a small and inexpensive apparatus for hyperpolarization of nuclear spins.

Preferably, the microwave irradiation unit includes a solid state power amplifier and a resonator different from a cavity resonator, placed in the space where the static magnetic field is formed. The light irradiation unit irradiates the sample placed in the resonator with light; and the microwave irradiation unit irradiates the sample placed in the resonator with microwave pulses amplified by the solid state power amplifier.

More preferably, the resonator different from the cavity resonator is a dielectric resonator or a loop gap resonator.

Thus, a small-size resonator can be used and it becomes possible to realize a still smaller and more inexpensive apparatus for hyperpolarization of nuclear spins.

Effects of Invention

By the present invention, it is possible to generate an aqueous solution containing benzoic acid derivative with hyperpolarized nuclear spins at room temperature environment without cooling the sample. The aqueous solution containing benzoic acid derivative with hyperpolarized nuclear spins used in an NMR spectrometer or MRI apparatus enables ultrasensitive chemical analysis or ultrasensitive imaging of metabolism.

Further, resolidification makes it possible to generally hyperpolarize various samples with high polarization. By way of example, it is possible to attain hyperpolarization of nuclear spins of a product contained in the aqueous solution in which benzoic acid derivative is dissolved, particularly nuclear spins of alkali metal (such as sodium, potassium, and lithium), or nuclear spins of a substance added later (such as pyruvic acid, urea, fructose, fumaric acid, caffeine, and fluorouracil). Therefore, ultrasensitive chemical analysis or ultrasensitive imaging of metabolism with still higher sensitivity becomes possible.

Further, it becomes possible to realize a small and inexpensive apparatus for hyperpolarization of nuclear spins enabling hyperpolarization of nuclear spins at room temperature, which can be used for medical application or chemical analysis. By attaching this hyperpolarization apparatus to a commercially available NMR spectrometer or to an MRI apparatus, ultrasensitive chemical analysis or ultrasensitive imaging of metabolism become possible.

DESCRIPTION OF EMBODIMENTS

Figure 1:
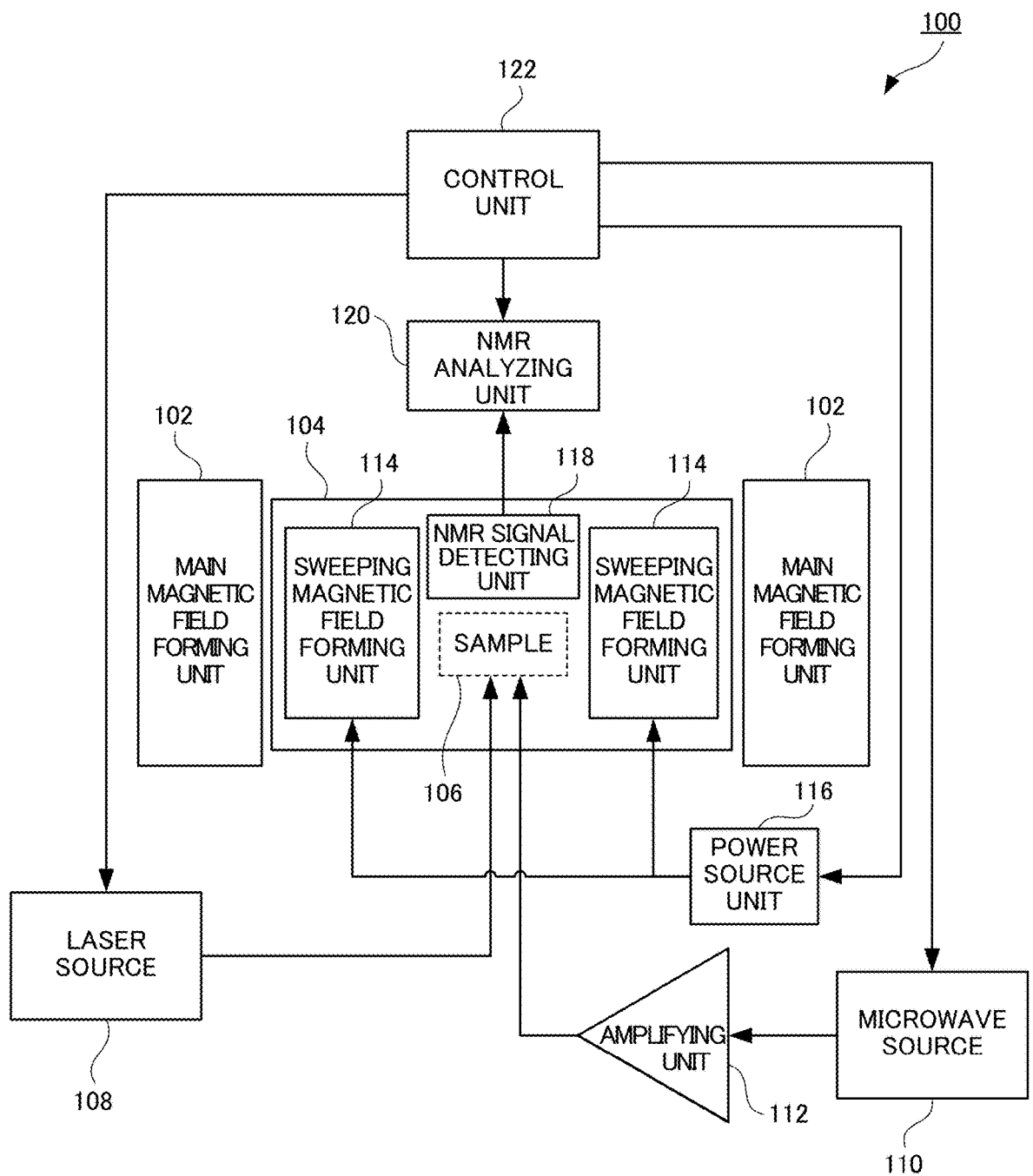
FIG. 1 is a block diagram showing a schematic structure of the nuclear spin hyperpolarization apparatus in accordance with a first embodiment of the present invention.

In the following embodiments, the same components are denoted by the same reference characters. Their names and functions are also the same. Therefore, detailed descriptions thereof will not be repeated.

First Embodiment

Referring to FIG. 1, a nuclear spin hyperpolarization apparatus 100 in accordance with an embodiment of the present invention includes: a main magnetic field forming unit 102; a cavity 104 arranged between magnetic poles of main magnetic field forming unit 102; a laser source 108 generating a laser beam to irradiate a sample 106 placed in cavity 104; a microwave source 110 generating a microwave to irradiate sample 106; and an amplifying unit 112 amplifying the microwave from microwave source 110. Nuclear spin hyperpolarization apparatus 100 further includes: a sweeping magnetic field forming unit 114 arranged in cavity 104; a power source unit 116 supplying electric current to sweeping magnetic field forming unit 114; an NMR signal detecting unit 118 for detecting an NMR signal; an NMR analyzing unit 120 analyzing NMR signals detected by NMR signal detecting unit 118; and a control unit 122 for controlling these units.

Figure 2:
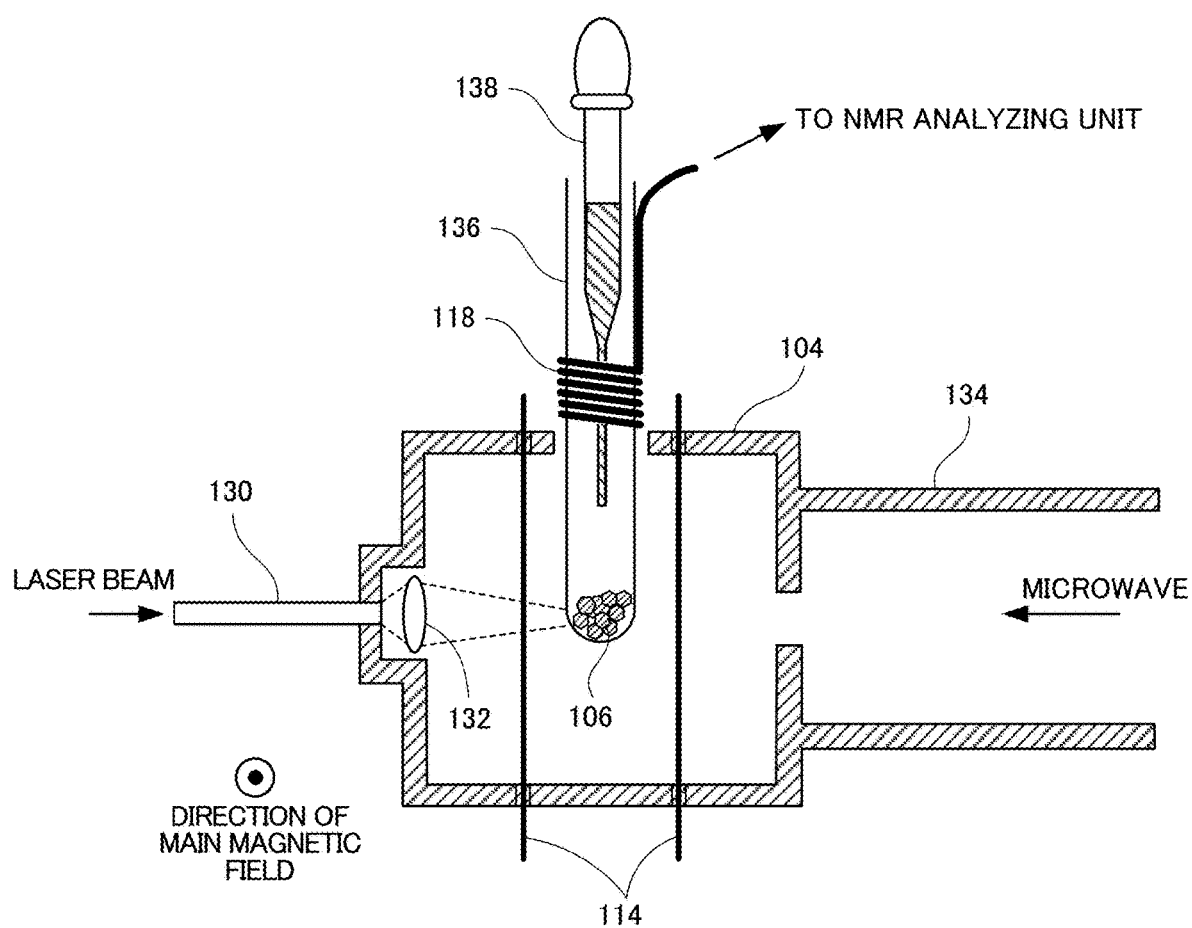
FIG. 2 is a schematic diagram showing portions surrounding a cavity of FIG. 1.

FIG. 2 shows specific exemplary structures of cavity 104 and its surroundings. In FIG. 2, cavity 104 and a waveguide 134 are shown in exploded cross-section.

Again referring to FIG. 1, main magnetic field forming unit 102 is an electromagnet to which electric current is fed from a power source (not shown), and it forms a static magnetic field of uniform direction and strength in the area where sample 106 is placed. In FIG. 1, two magnetic field forming units 102 are arranged, representing two electromagnets having facing magnetic poles (for example, facing Helmholtz coils). Polarization of photoexcited triplet electron spins is not in proportion to temperature or magnetic field strength and, therefore, it is unnecessary to use a magnet that generates a high magnetic field such as a superconducting magnet in the main magnetic field forming unit 102. Therefore, a normal conducting magnet may be used as main magnetic field forming unit 102.

It is noted that main magnetic field forming unit 102 may be an electromagnet not having facing magnetic poles, such as an electromagnet using an air core solenoid coil. In that case, cavity 104 is placed inside the solenoid coil. Alternatively, main magnetic field forming unit 102 may be a permanent magnet.

Cavity 104 functions as a resonator for resonating a microwave supplied from microwave source 110 through amplifying unit 112 and waveguide 134 (FIG. 2). Cavity 104 is formed of an electric conductor that is not a magnetic material. Cavity 104 is formed such that resonance frequency becomes equal to the frequency of microwave output from microwave source 110. A junction between cavity 104 and waveguide 134 is preferably coupled by a known iris, so as to suppress reflection of the supplied microwave.

Laser source 108 shown in FIG. 1 outputs a laser beam of a prescribed wavelength for a prescribed time period at prescribed timing, under control of control unit 122. The output laser beam is transmitted through a light transmitting unit 130 (FIG. 2) to cavity 104. In cavity 104, a light collecting unit 132 is provided, which collects the laser beam emitted from light transmitting unit 130 to irradiate sample 106. Laser source 108 is, by way of example, a known flash-lamp-excited dye laser. Light transmitting unit 130 is, for example, an optical fiber and light collecting unit 132 is, for example, a lens.

Microwave source 110 generates and outputs a microwave of a prescribed frequency for a prescribed time period at prescribed timing, under control of control unit 122. A known microwave generating apparatus may be used as microwave source 110. In DNP, microwave pulses are supplied to the sample and, therefore, pulse waves are generated by a switch (not shown) from the microwave continuously output from microwave source 110.

Amplifying unit 112 amplifies and outputs the microwave output from microwave source 110. By way of example, a known traveling wave tube amplifier (hereinafter also referred to as TWT amplifier) is used as amplifying unit 112. A known circulator may be arranged on the output side of amplifying unit 112 to monitor microwave pulses to be supplied to the sample.

Sweeping magnetic field forming unit 114 is for forming a sweeping magnetic field, which will be described later, and a coil may be used. Power source unit 116 feeds electric current to sweeping magnetic field forming unit 114 under control of control unit 122. The sweeping magnetic field is to excite a set of spins of which resonance frequency varies in a certain width. By varying over time the value of the current flowing across sweeping magnetic field forming unit 114, the magnetic field strength is changed, or the magnetic field is swept. The strength of sweeping magnetic field is sufficiently smaller than the strength of the main magnetic field. The direction of sweeping magnetic field is the same as or reverse to the direction of main magnetic field. FIG. 2 shows an example in which a known saddle coil is used as sweeping magnetic field forming unit 114. In FIG. 2, two of four parallel linear portions forming sweeping magnetic field forming unit 114 (saddle coil) are depicted. In FIG. 2, the direction of main magnetic field is vertical to the sheet and, therefore, by applying an electric current in the reverse direction to the two linear portions (as well as to the remaining two linear portions not shown), a sweeping magnetic field in the direction same as or reverse to the direction of main magnetic field can be formed in the area where sample 106 is placed.

NMR signal detecting unit 118 is a coil for detecting an NMR signal (for example, FID signal) caused by spins in precessional motion around the main magnetic field. The coil implementing NMR signal detecting unit 118 can detect a change in magnetic field in the direction perpendicular to the main magnetic field. NMR analyzing unit 120 measures the NMR signal using NMR signal detecting unit 118 and conducts known NMR analysis, under control of control unit 122. It is noted that resonance frequency of NMR signal detecting unit 118 is adjusted to be equal to the NMR frequency in accordance with the strength of main magnetic field by an adjustment component (not shown), such as a capacitor.

Referring to FIG. 2, a sample container unit 136 is for holding sample 106, and it is formed of a material that transmits the supplied laser beam and microwave. Sample container unit 136 is, for example, a glass tube. It is preferred that sample container unit 136 and NMR signal detecting unit 118 are displaceable with respect to cavity 104. Specifically, it is desirable to provide a mechanism that moves sample container unit 136 to the outside of cavity 104, allowing input of sample 106 to sample container unit 136, and moves the sample container unit 136 having the sample 106 input therein to be placed at a prescribed position in cavity 104. Similarly, it is desirable to provide a mechanism that moves NMR signal detecting unit 118 to the outside of cavity 104, and moves the NMR signal detecting unit 118 to be placed at a prescribed position (around the sample 106) in cavity 104.

A solvent supplying unit 138 is for holding a solution (solvent) for dissolving solid sample 106. In FIG. 2, a dropper is shown as solvent supplying unit 138. Solvent supplying unit 138 (dropper) drops the solution it holds to sample 106 and generates a solution that contains sample 106.

(Nuclear Spin Hyperpolarization)

In the following, a method of hyperpolarization of nuclear spins of sample 106 using nuclear spin hyperpolarization apparatus 100 of FIG. 1 will be described with reference to FIG. 3.

Figure 4:
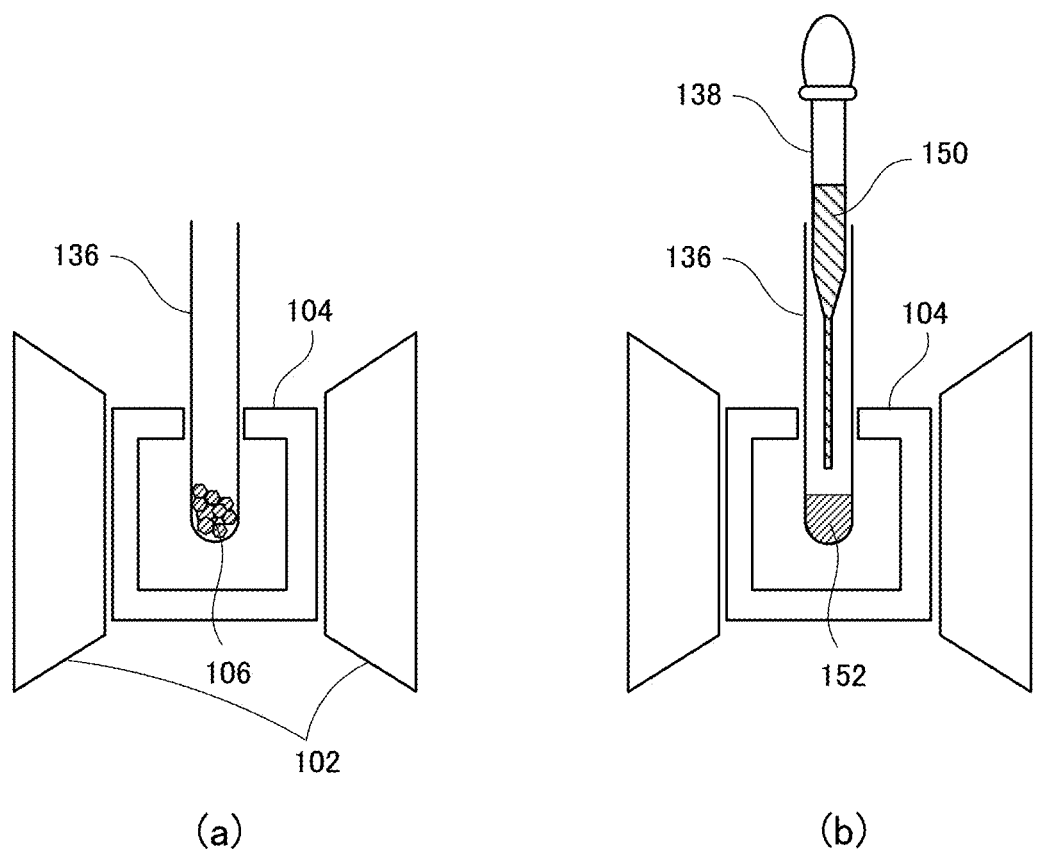
FIG. 4 is a schematic diagram showing states of a sample of which nuclear spins are to be hyperpolarized.

At step 300, a sample as an object of processing is prepared. Specifically, benzoic acid ($C_6H_5COOH$) powder doped with a small amount of pentacene ($C_{22}H_{14}$) is introduced as sample 106 to sample container unit 136. At this time, it is desired to stir to have pentacene dispersed uniformly among benzoic acid molecules. NMR signal detecting unit 118 is set to sample container unit 136 containing sample 106, and sample container unit 136 is arranged in cavity 104 such that sample 106 is positioned at the center of cavity 104 as shown in FIG. 4(a). For convenience, sweeping magnetic field forming unit 114, NMR signal detecting unit 118, waveguide 134 and the like are not shown in FIG. 4.

The amount of benzoic acid is determined in accordance with the performance (output power) of laser source used. When a laser source capable of outputting a strong laser beam is used, a larger amount of benzoic acid can be used.

At step 302, while a static magnetic field is formed by conducting electricity to main magnetic field forming unit 102, laser source 108, microwave source 110 and sweeping magnetic field forming unit 114 are operated under control of control unit 122 to conduct triplet DNP on sample 106. Specifically, referring to FIG. 5, sample 106 is irradiated with a laser beam from laser source 108 for a time period T1, and for a following time period T2, sample 106 is irradiated with a microwave from microwave source 110, while the magnetic field is swept by sweeping magnetic field forming unit 114. Sweeping of magnetic field is optional for the time period T1.

Figure 5:
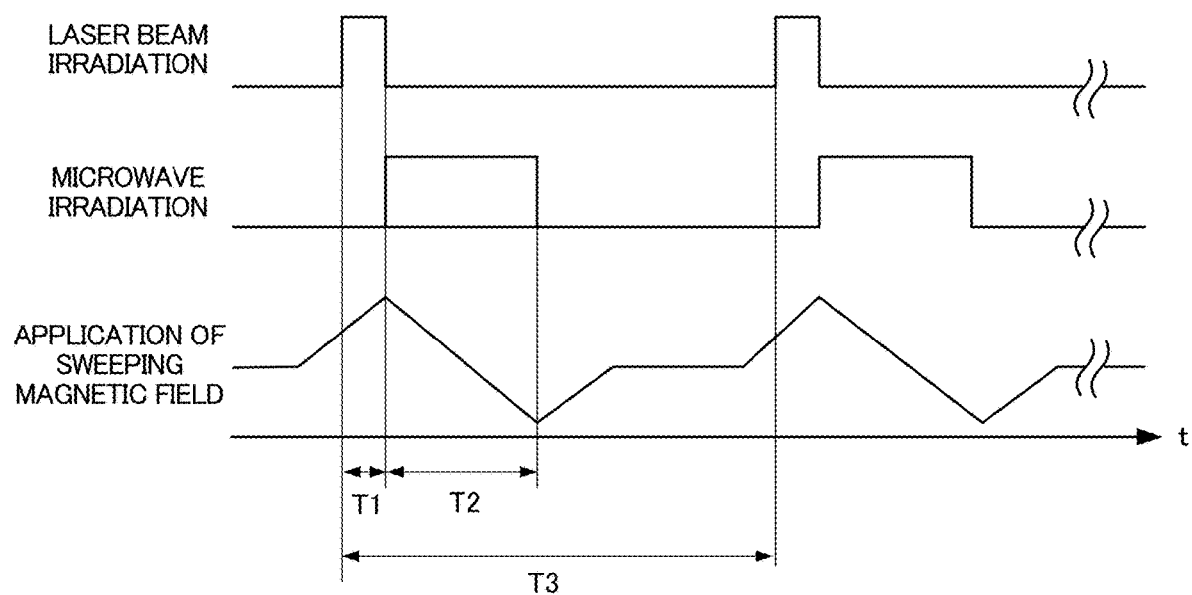
FIG. 5 is a timing chart showing sequences of laser irradiation, microwave irradiation and sweeping magnetic field application used in the apparatus of FIG. 1.

At step 304, control unit 122 determines whether or not to end triplet DNP. If it determines to end, the control proceeds to step 306. Otherwise, after the lapse of time period T3, the control returns to step 302. Thus, the sequence shown in FIG. 5 is repeated with time T3 as one cycle.

Whether or not to end triplet DNP may be determined, for example, by setting a number of runs N beforehand and by determining whether or not the number of laser irradiation and microwave irradiation has reached N. Alternatively, whether or not to end triplet DNP may be determined by setting a run time ΔT beforehand and by determining whether or not the time ΔT has passed from the first laser irradiation and microwave irradiation.

Figure 6:
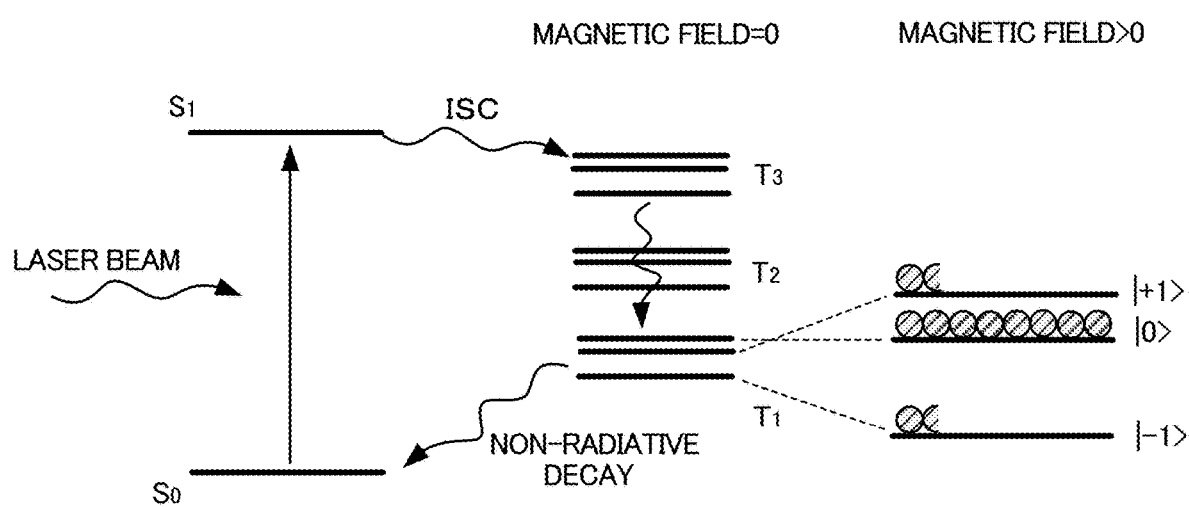
FIG. 6 shows energy level of pentacene.

FIG. 6 shows pentacene energy level. When pentacene is irradiated with laser beam, pentacene electrons are excited by the laser beam and make a transition from ground state So to excited singlet state $S_1$. Thereafter, transition mainly to the ground state occurs with light emission such as induced radiation and, in addition, transition to excited triplet state ($T_3$) also occurs due to spin orbit interaction (ISC: Inter System Crossing). By a selection rule in this quantum process, electron spin distribution is significantly biased to 22%. The excited triplet state decays (transits) to the ground state $S_0$ in about 100 micro-seconds, and until that time, pulse DNP is executed by microwave irradiation. If pentacene exists in the magnetic field, the level of excited triplet state is separated to three levels as shown on the right side of FIG. 6. Therefore, by irradiating microwave having a frequency corresponding to the difference between |−1> level and |0> level or the difference between |0> level and |+1> level, hyperpolarization of electron spins is transferred to nuclear spins of hydrogen ($^1H$) (hereinafter also referred to as hydrogen nuclear spins), by, for example, a mechanism of cross-polarization. The duration of microwave irradiation is preferably at least 1 μs. Here, hydrogen nuclear spins of pentacene are hyperpolarized, and the hyperpolarization is transferred to hydrogen nuclear spins of benzoic acid. Therefore, as described above, by repeating step 302, hyperpolarization of hydrogen nuclear spins of sample 106 as a whole becomes possible.

If it is determined to end triplet DNP, at step 306, control unit 122 stops operations of laser source 108, microwave source 110 and power source unit 116.

At step 308, solvent 150 held in solvent supplying unit 138 is dropped to sample 106 to dissolve benzoic acid in sample 106 as shown in FIG. 4(b). Thus, an aqueous solution 152 is generated, in which benzoic acid in the sample is dissolved. Solvent 150 is, by way of example, sodium carbonate aqueous solution and, in that case, sodium benzoate aqueous solution is generated as aqueous solution 152. Solvent 150 may be heated to a temperature higher than room temperature. Pentacene is insoluble and hence, it can easily be removed by, for example, filtering.

In this manner, an aqueous solution (sodium benzoate aqueous solution) containing benzoic acid with hyperpolarized hydrogen nuclear spins can be generated. Use of this aqueous solution in a known NMR spectrometer and a known MRI apparatus enables ultrasensitive NMR spectroscopy and ultrasensitive MRI. Benzoic acid is harmless to human body and it is metabolized in human body. Therefore, the aqueous solution containing benzoic acid but not containing pentacene that is harmful to human body can safely be used, for example, in MRI inspection of human body.

While the end of triplet DNP is determined by using a preset repetition number N or by using a preset runtime ΔT in the description above, it is not limiting. By way of example, NMR signals may be monitored by NMR signal detecting unit 118 while repeating triplet DNP, and end of triplet DNP may be determined when an NMR signal of a prescribed strength is detected.

Though the liquid for dissolving benzoic acid is dropped to benzoic acid powder in the foregoing, it is not limiting. By way of example, the liquid for dissolving benzoic acid may be sprayed to benzoic acid powder. Alternatively, benzoic acid powder may be put into the liquid for dissolving benzoic acid.

Though use of benzoic acid doped with pentacene as a sample has been described in the foregoing, it is not limiting.

By way of example, a benzoic acid derivative may be used in place of benzoic acid, and a pentacene derivative may be used in place of pentacene. Specifically, "benzoic acid derivative" doped with "pentacene derivative" may be used as a sample. Here, benzoic acid derivative means benzoic acid and benzoic acid having any one or more hydrogens of its benzene ring replaced by halogen, alkali metal, hydroxyl group, carboxy group, phenyl group, amino group or the like.

Figure 14:
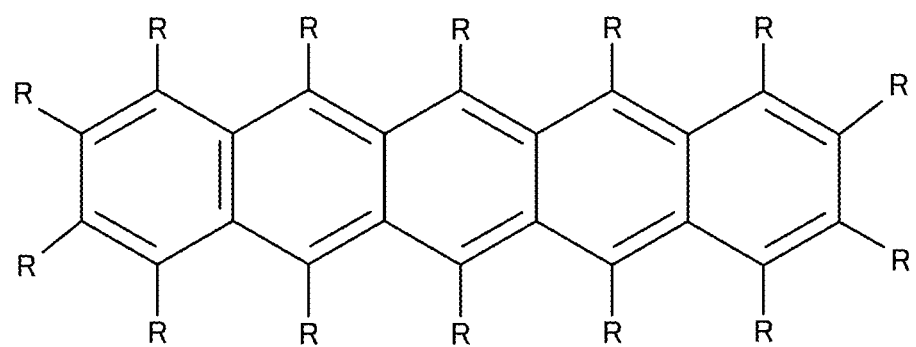
FIG. 14 is a formula representing a pentacene derivative.

Pentacene derivative means pentacene and molecules disclosed in Patent Literature 4, that is, one represented by the formula shown in FIG. 14.

In the formula of FIG. 14, R independently represents a hydrocarbon group of carbon number 1 to 20 that may contain hydrogen atom (H), deuterium atom (D), or at least one atom selected from the group consisting of oxygen atom, sulfur atom and silicon atom, and at least one R is a hydrocarbon group of carbon number 1 to 20 that may contain at least one atom selected from the group consisting of oxygen atom, sulfur atom and silicon atom.

Though hyperpolarization of hydrogen nuclear spins of benzoic acid derivative has been described above, it is possible to attain hyperpolarization of other nuclear spins. For example, when benzoic acid derivative containing carbon 13 ($^{13}C$) of non-zero nuclear spin is used as the sample and polarization is transferred from hydrogen nuclear spins to carbon 13 nuclear spins by known cross-polarization before executing step 308, by executing step 308, a sodium benzoate aqueous solution with hyperpolarized carbon 13 nuclear spins can be generated. For transferring polarization between first and second nuclear spins (here, hydrogen nuclear spins and carbon 13 nuclear spins) by cross-polarization, sample container unit 136 containing sample 106 is moved to an environment of higher magnetic field than the magnetic field formed by main magnetic field forming unit 102, and in accordance with the static magnetic field applied to sample 106, microwaves of respective resonance frequencies of the first and second nuclear spins (microwaves having the frequency satisfying Hartmann-Hahn matching condition) are irradiated (hereinafter also referred to as cross-polarization irradiation).

Further, a benzoic acid derivative containing an isotope of carbon of non-zero nuclear spin other than carbon 13 may be used, or a benzoic acid derivative containing an isotope of oxygen, nitrogen or the like of non-zero nuclear spin may be used. For example, a benzoic acid derivative containing oxygen 17 ($^{17}O$) or nitrogen 15 ($^{15}N$) may be used. In that case also, the isotope nuclear spins can be hyperpolarized by cross-polarization before executing step 308. The isotopes may not be stable and they may decay in a short half life.

Further, at step 300, benzoic acid derivative doped with pentacene derivative further doped with a substance soluble in benzoic acid derivative (when the benzoic acid derivative is heated to the melting point or higher and becomes liquid) may be used as a sample. The substance soluble in benzoic acid derivative has non-zero nuclear spin and is a substance to be hyperpolarized (hereinafter also referred to as a target substance). By way of example, it is protocatechuic acid. By the triplet DNP at step 302, the hydrogen nuclear spins of target substance come to be hyperpolarized as are hydrogen nuclear spins of benzoic acid derivative. Thereafter, at step 308, an aqueous solution containing benzoic acid derivative with hyperpolarized hydrogen nuclear spins and target substance with hyperpolarized hydrogen nuclear spins can be generated.

Further, the sample may contain a plurality of different types of benzoic acid derivatives. Alternatively, the sample may be doped with a plurality of different types of pentacene derivatives, or the sample may be doped with a plurality of different types of target substances.

When a benzoic acid derivative containing isotope of carbon, oxygen, nitrogen or the like of non-zero nuclear spin is used as the sample, the hyperpolarization of electron spins of pentacene derivative may be directly transferred to the nuclear spins of the isotope contained in benzoic acid derivative by triplet DNP at step 302, without utilizing the above-described hydrogen nuclear spins. By way of example, when a benzoic acid derivative containing carbon 13 is used, a phenomenon in which hyperpolarization of pentacene derivative electron spins is directly transferred to carbon 13 nuclear spins may possibly occur.

Similarly, when a target substance containing an isotope of carbon, oxygen, nitrogen or the like of non-zero nuclear spin is added to the sample, electron spin hyperpolarization of pentacene derivative may be directly transferred to the nuclear spins of the isotope contained in the target substance.

Though use of samples containing a benzoic acid derivative has been described above, it is not limiting. The inventors have found that a mixture prepared by mixing a benzoic acid derivative and a partner molecule other than the benzoic acid derivative at a prescribed ratio (particularly, such as a cocrystalline polycrystal sample) attains as high polarization as that of a sample of benzoic acid only. Here, "partner molecule" means a carboxylic acid different from benzoic acid derivative, or a substance such as a base forming salt with benzoic acid derivative. Specifically, such a mixture (such as cocrystalline polycrystal sample) may be used as sample 106. By way of example, cocrystalline or eutectic polycrystal sample or an amorphous sample prepared by mixing 1:1 (mole ratio) of benzoic acid and nicotine acid ($C_5H_5NCOOH$) or salicylic acid ($C_6H_4(OH)COOH$) may be used, and by dissolving the sample after conducting triplet DNP as described above, hyperpolarization of hydrogen nuclear spins contained in nicotine acid or salicylic acid, which are molecules having important functions in human body, becomes possible.

The ratio of mixing benzoic acid derivative and a partner molecule other than benzoic acid derivative is not limited to the mole ratio of 1:1, and it may be determined as appropriate. By way of example, mixture of benzoic acid derivative and the partner molecule mixed at the mole ratio in the range of 10:1 to 1:3 may be used.

Conventionally, it was impossible to attain hyperpolarization of nicotine acid and salicylic acid using pentacene. In order to conduct triplet DNP, it is the minimum requirement that the target can dissolve pentacene. Even when it can dissolve pentacene, efficiency of triplet DNP could be very low, since optical and spin characteristics of pentacene could be significantly distorted depending on its crystal structure. Nicotine acid as simple body when melt can dissolve pentacene, whereas pentacene is precipitated when solidified. Salicylic acid as simple body in solid state can dissolve pentacene. Absorption efficiency, however, becomes low, hindering highly efficient hyperpolarization by triplet DNP.

Example 1

In the following, results of experiments will be described to show effectiveness of the present invention. Experiments were conducted using the structure shown in FIG. 1.

Using a flash-lamp-excited dye laser as laser source 108, samples were irradiated with the laser beam having pulse width of 1 micro-second (T1 in FIG. 5 represents 1 μs), wavelength of 590 nm, repetition frequency of 50 Hz (T3 in FIG. 5 represents 20 ms) and optical output of 10 mJ. An electromagnet forming a static magnetic field of 0.4T was used as main magnetic field forming unit 102. A microwave source outputting microwaves of 12 GHz was used as microwave source 110. Continuous waves of 12 GHz output from microwave source 110 were pulsated by a switch to generate pulses of 10 micro seconds (T2 in FIG. 5 represents 10 μs), amplified to peak power of about 10W by a TWT amplifier, and input to cavity 104. Cavity 104 used had resonance frequency of 12 GHz at TE 102 mode. The cavity and the waveguide were coupled by means of an iris, and adjusted to have a critical coupling (non-reflective state). The magnetic field was linearly swept for 10 μs duration of microwave irradiation. A signal for magnetic field sweeping was generated by a function generator, and a signal amplified by an operational amplifier such that the amplitude of sweeping magnetic field (magnetic field strength) attained about 10 mT was input to sweeping magnetic field forming unit 114.

In order to verify nuclear spin polarization and the like by NMR signals after hyperpolarization by triplet DNP, apparatuses for NMR experiments (NMR signal detecting unit 118 and NMR analyzing unit 120) including NMR spectrometer were used. The NMR coil in NMR signal detecting unit 118 was resonated at 17 MHz by an external capacitor. Further, NMR spectrometer was used as control unit 122 for controlling timings of operating the microwave switch, the function generator and the flash-lamp-excited dye laser.

Figure 7:
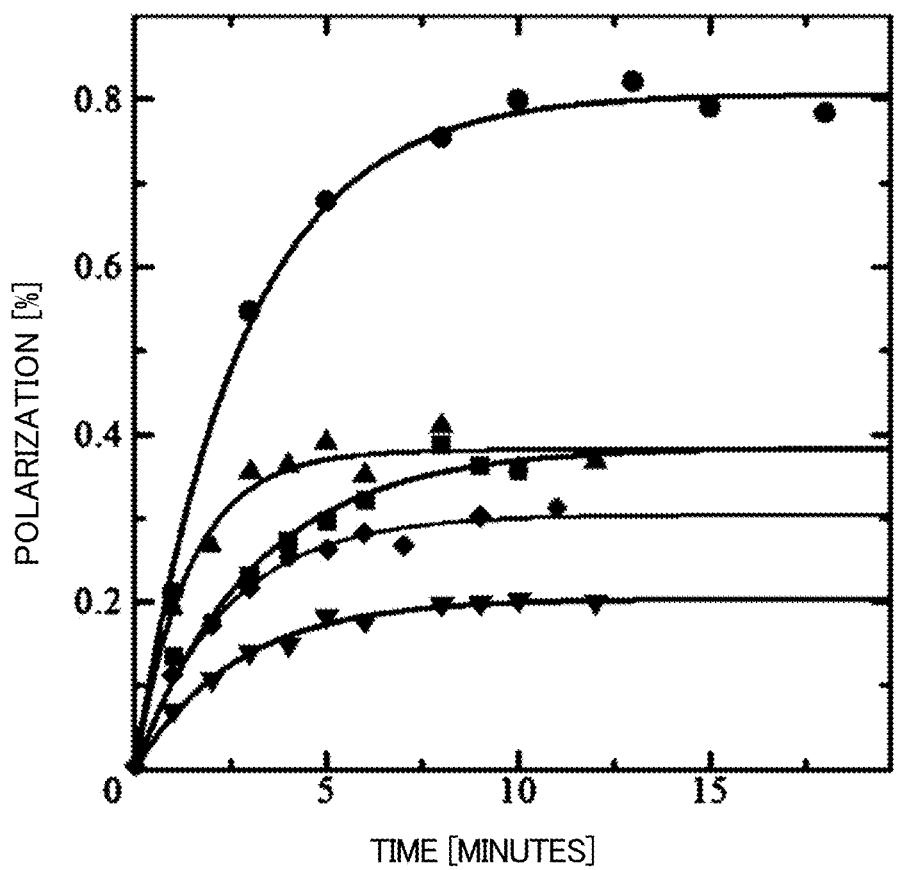
FIG. 7 is a graph showing polarization of hydrogen nuclear spins of benzoic acid.

FIG. 7 shows results of experiments using powder samples prepared by doping benzoic acid powder (about 0.5 mg) with pentacene to various concentrations. In FIG. 7, triangles indicate measurements of a sample having pentacene concentration of 0.06 mol %; squares indicate pentacene concentration of 0.04 mol %; rhomboids indicate pentacene concentration of 0.02 mol %; and inverted triangles indicate pentacene concentration of 0.01 mol %. Circles indicate measurements of a sample prepared by doping benzoic acid ($C_6H_5COOD$) having carboxy group deuterated (H replaced by D) with 0.04 mol % deutrated pentacene. Here, mol % indicates ratio (%) of the number of moles of pentacene to the number of moles of benzoic acid.

As can be seen from FIG. 7, the sample having pentacene concentration of 0.04 mol % attained the polarization of 0.4%. As can be seen from graphs plotted by squares, rhomboids and inverted triangles, finally attained polarizations were generally in proportion to the pentacene concentration. It is noted, however, that the finally attained polarization of the sample having pentacene concentration of 0.06 mol % (graph plotted with triangles) was the same as the sample having pentacene concentration of 0.04 mol % (graph plotted with squares). The reason for this may be that in the sample having pentacene concentration of 0.06 mol %, pentacene was too dense and it caused promotion of spin-lattice relaxation by heat generation from the sample, deterioration of sample quality or the like.

The time for hydrogen nuclear spin lattice relaxation of benzoic acid powder was 4 minutes. In solid body, hydrogen in carboxy group has high mobility, causing nuclear spin lattice relaxation. When only the carboxy group of benzoic acid was partially deuterated, the longitudinal relaxation time $T_1$ was 5 minutes. Further, when pentacene was also deuterated, polarization as high as 0.8% (graph plotted with circles) could be attained by triplet DNP for 10 minutes at room temperature.

This polarization is 810 times higher than thermal equilibrium polarization at room temperature with magnetic field strength of 3T, at which MRI is typically conducted, and it exceeds 660 times, which is the thermal limitation of DNP.

Example 2

Figure 8:
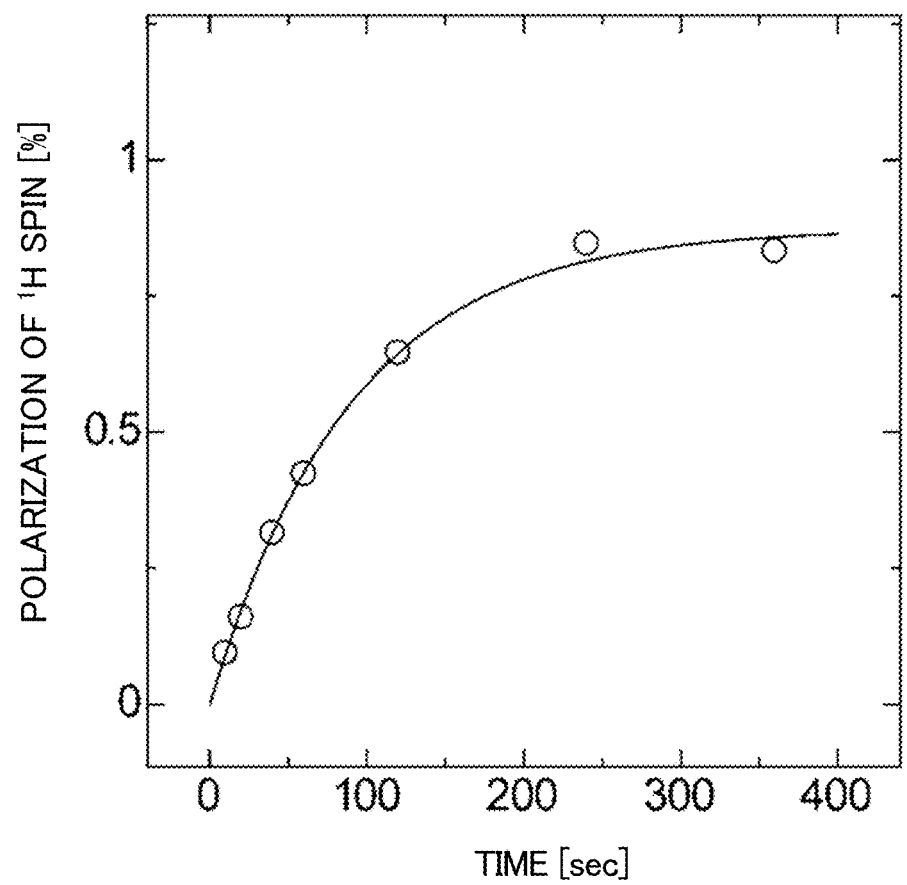
FIG. 8 is a graph showing polarization of hydrogen nuclear spins of salicylic acid.

FIG. 8 shows results of experiments conducted by the apparatuses of the same structure as Example 1 and using powder samples prepared by mixing deuterated benzoic acid (every H was replaced by deuterium D), salicylic acid and pentacene at 1:1:0.04 (mole ratio). The ordinate of FIG. 8 indicates polarization of hydrogen nuclear spins ($^1$H). Since the deuterated benzoic acid used did not have hydrogen nuclear spins ($^1$H), the polarization of FIG. 8 indicates polarization of hydrogen nuclear spins ($^1$H) of salicylic acid. The attained hydrogen nuclear spin polarization was 0.8%, and thus, polarization comparable to that of benzoic acid simple body could be attained even by mixed partner molecule (salicylic acid).

Example 3

Using the apparatuses of the same structure and the same sample as in Example 1, the sample was hyperpolarized, and then the sample was dissolved and NMR signals were monitored. Specifically, powder sample (benzoic acid doped with pentacene) was put in a glass tube, subjected to triplet DNP for 10 minutes, 9° pulses were applied with the interval of 1 second, and magnetization was measured. Approximately 15 seconds after the start of measurement, sodium carbonate aqueous solution of about 80° C. (concentration:1 M (molar)) was introduced to the glass tube to dissolve the sample.

Figure 9:
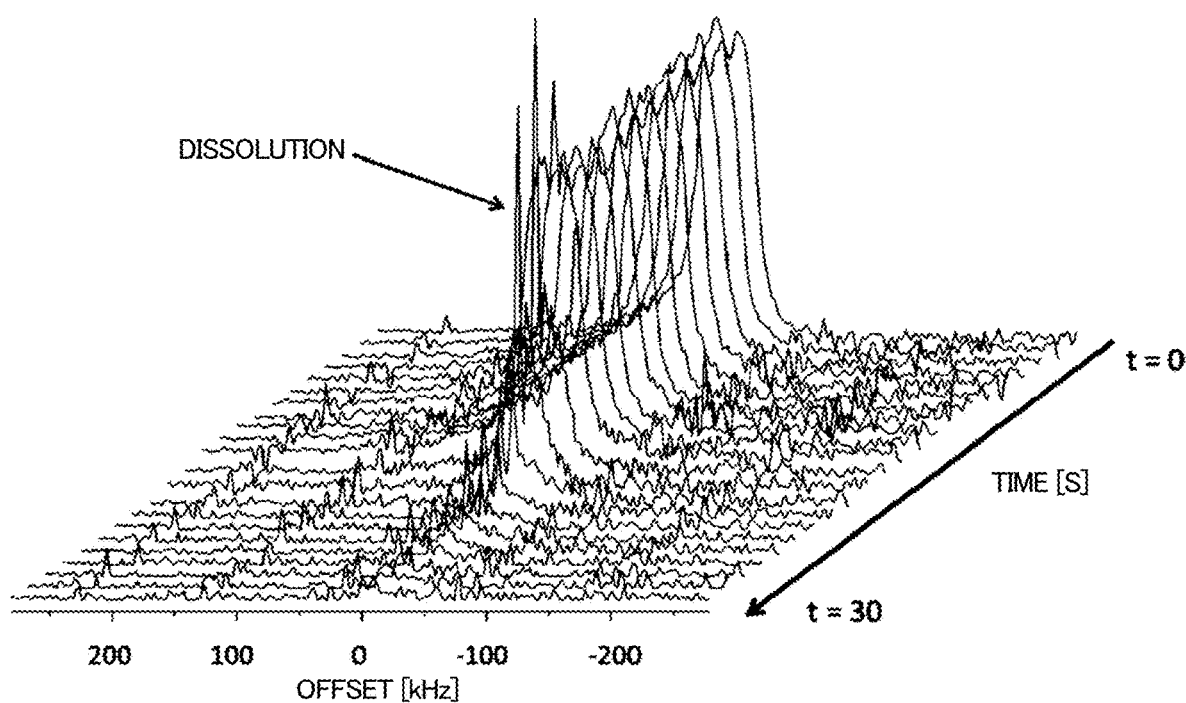
FIG. 9 is a graph showing changes in NMR signals before and after dissolution of benzoic acid.

The observed NMR signals (FID signals subjected to Fourier transform) are as shown in FIG. 9. Until t=15 seconds, the sample is in the solid state and, hence, the spectrum is wide because of the influence of dipole relaxation. After the introduction of sodium carbonate aqueous solution, the spectrum changes to sharp peak derived from motional narrowing characteristic of liquid state. The integrated intensity of the signal at t=15 (sec) is almost the same as that at t=16 (sec), and therefore, it is understood that benzoic acid is dissolved with most of the nuclear spins maintaining their polarization. In the liquid state, spin lattice relaxation time becomes a few seconds and with the time constant, the signals has rapidly decayed. Thus, it is confirmed that nuclear hyperpolarization of benzoic acid was maintained.

Example 4

Experiment was conducted using the apparatuses of the same structure as in Example 1 and using a sample that could attain higher polarization than Example 1. Specifically, the sample was prepared by doping bulk benzoic acid (one single crystal of about 0.5 mg), rather than benzoic acid powder, with pentacene.

Figure 10:
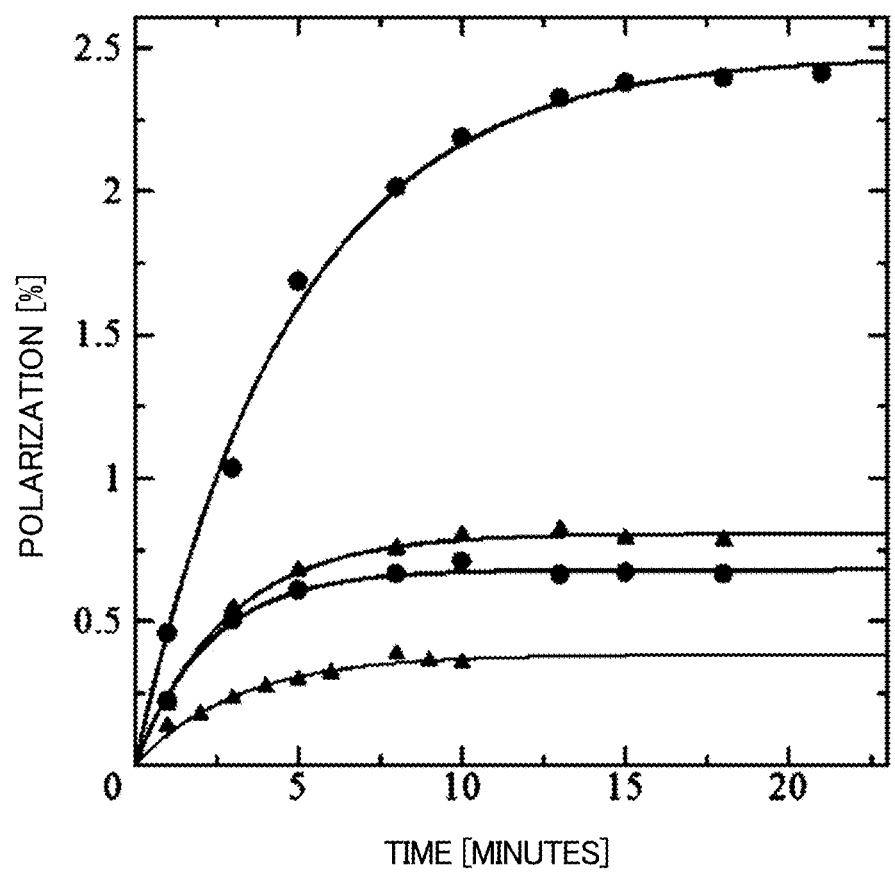
FIG. 10 is a graph showing polarizations of hydrogen nuclear spins of powder and single crystal samples of benzoic acid.

FIG. 10 shows the results of measurements. Pentacene concentration was 0.04 mol % in every sample. Two graphs plotted with triangles indicate measurements of samples using benzoic acid powder, the upper curve indicates measurement of the sample prepared by doping partially deuterated benzoic acid with deuterated pentacene, and the lower curve indicates measurement of the sample in which neither pentacene nor benzoic acid was deuterated. Two graphs plotted with circles indicate measurements of samples using single crystal benzoic acid, the upper curve indicates measurement of the sample prepared by doping partially deuterated benzoic acid with deuterated pentacene, and the lower curve indicates measurement of the sample in which neither pentacene nor benzoic acid was deuterated.

When benzoic acid powder is used, because of anisotropy of zero field splitting interactions, wide ESR spectrum results and triplet fraction becomes very low. As a result, polarization does not increase. In contrast, when bulk single crystal is used, the ratio of triplet fraction increases as indicated by the uppermost graph of FIG. 10 and, in addition to this effect, the crystal has high quality as it is not fractured, leading to longer $T_1$. Thus, polarization as high as 2.4% was attained. This is 2500 times higher than the thermal equilibrium polarization at room temperature with magnetic field strength of 3T, at which MRI is typically conducted.

It takes time to dissolve bulk single crystal. One solution is, for example, to form the sample as thin layers (single crystals). Since surface area increases, it can be dissolved quickly.

Second Embodiment

In the first embodiment, hyperpolarization of hydrogen nuclear spins of benzoic acid derivative has been described. In the second embodiment, hyperpolarization of nuclear spins of various samples in general will be described.

Figure 11:
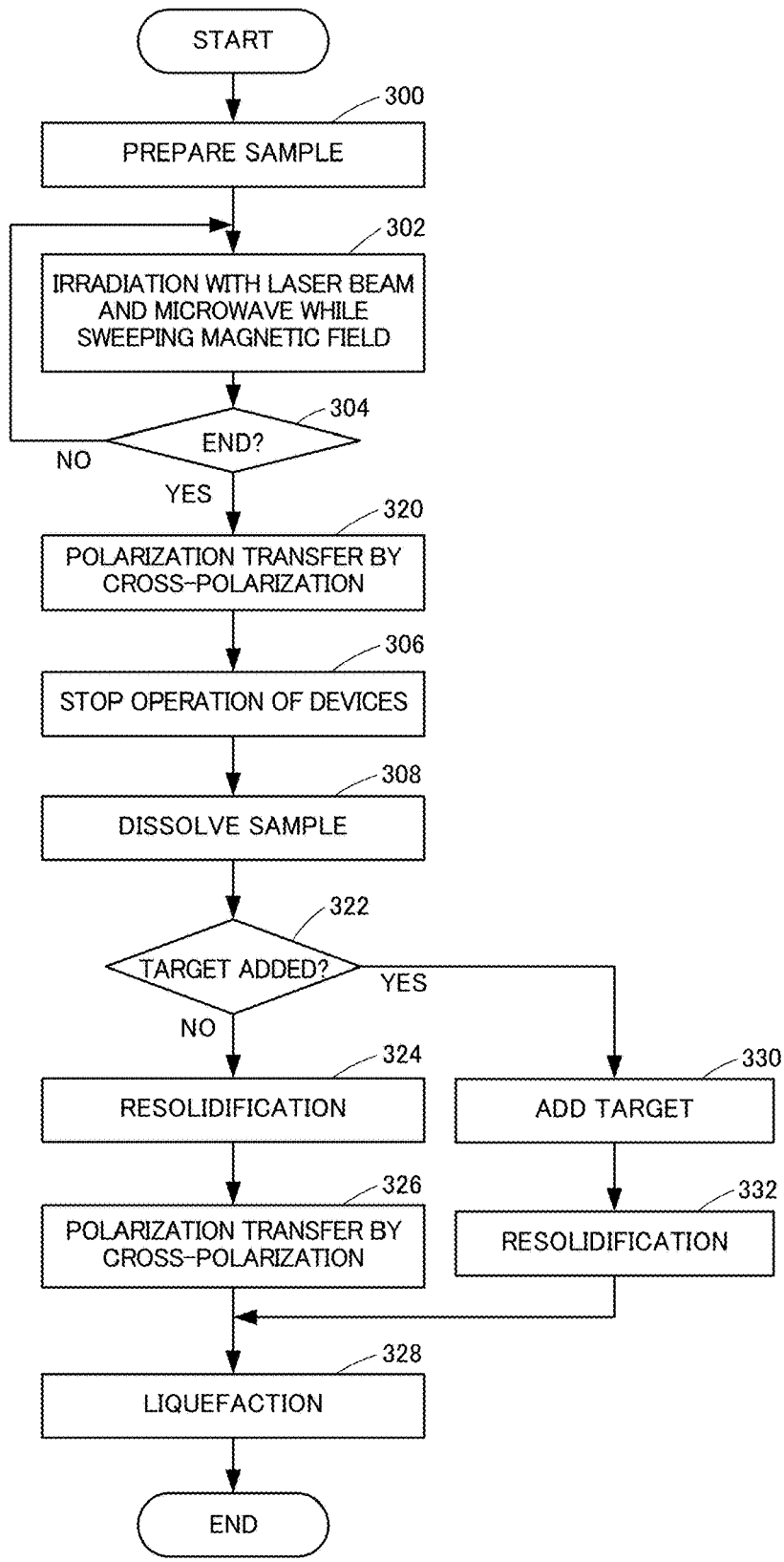
FIG. 11 is a flowchart representing a nuclear spin hyperpolarization method in accordance with a second embodiment of the present invention.

In the present embodiment also, as in the first embodiment, nuclear spin hyperpolarization apparatus 100 shown in FIG. 1 is used. FIG. 11 shows the nuclear spin hyperpolarization method in accordance with the present embodiment. The flowchart of FIG. 11 has steps 320 to 332 added to the flow chart of FIG. 3. The process of steps 300 to 308 is the same as the first embodiment described above and, therefore, description will not be repeated. In the following, description will be given mainly focusing on steps 320 to 332.

In the present embodiment, as in the first embodiment, an object sample (benzoic acid derivative powder doped with a small amount of pentacene derivative) is prepared and triplet DNP is conducted (step 302). It is noted, however, that the benzoic acid derivative in the sample contains carbon 13.

Thereafter, at step 320, by cross-polarization irradiation, polarization is transferred from hyperpolarized hydrogen nuclear spins to carbon 13 nuclear spins. In cross-polarization irradiation, microwaves of respective resonance frequencies of hydrogen nuclear spins and carbon 13 spins are irradiated in accordance with the applied static magnetic field.

At step 308, the sample is dissolved to generate an aqueous solution containing benzoic acid derivative with hyperpolarized carbon 13 nuclear spins (specifically, sodium benzoate aqueous solution), and at step 322, the process flow is branched depending on whether or not a substance to be subjected to hyperpolarization (target substance) is to be added to the present aqueous solution. If not, the flow proceeds to step 324. If any target substance is to be added, the flow proceeds to step 330.

Figure 12:
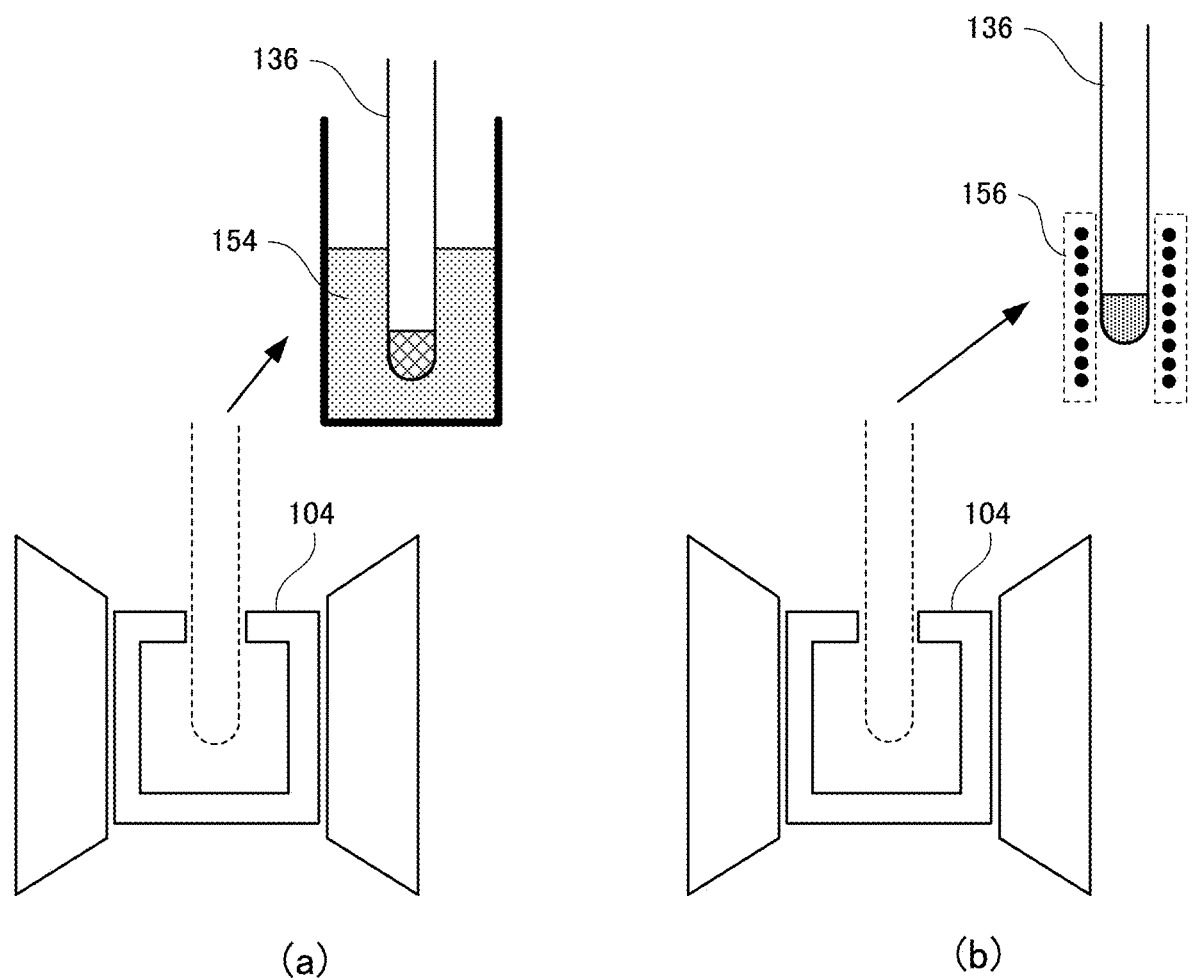
FIG. 12 is a schematic diagram showing states of a sample of which nuclear spins are to be hyperpolarized.

At step 324, the aqueous solution (liquid) obtained at step 308 is resolidified. Specifically, as shown, for example in FIG. 12(a), sample container unit 136 is taken out from cavity 104 and put into liquid nitrogen 154 and cooled. In this manner, sodium benzoate aqueous solution in sample container unit 136 is frozen to solid body.

At step 326, the frozen sodium benzoate aqueous solution is subjected to cross-polarization irradiation, so that polarization is transferred from hyperpolarized carbon 13 nuclear spins to sodium nuclear spins.

At step 328, the solidified sodium benzoate aqueous solution in sample container unit 136 is liquefied. Specifically, as shown, for example in FIG. 12(b), sample container unit 136 is taken out from cavity 104 and heated by a heater 156 and the sample is melt. In this manner, sodium benzoate aqueous solution (liquid) containing hyperpolarized sodium ions can be obtained.

If a target is to be added, at step 330, the target substance is put into the sodium benzoate aqueous solution in sample container unit 136. By way of example, pyruvic acid ($CH_3COCOOH$) including carbon 13 is added.

At step 332, the aqueous solution with the target added is resolidified as at step 324. Thus, benzoic acid derivative and target (for example, pyruvic acid) are fixed in close vicinity. In the fixed state, nuclear spin polarization diffuses (spin diffusion) over molecules and, therefore, the nuclear spin polarization of carbon 13 of benzoic acid derivative is transferred to the carbon 13 nuclear spins of pyruvic acid, thereby generating pyruvic acid with carbon 13 nuclear spins hyperpolarized.

As described above, at step 328, the solidified sodium benzoate aqueous solution containing the target in sample container unit 136 is melt. Thus, an aqueous solution containing pyruvic acid with hyperpolarized carbon 13 nuclear spins can be obtained.

As described above, an aqueous solution containing hyperpolarized sodium ions or a target with hyperpolarized carbon 13 nuclear spins can be obtained. The thus obtained solution may be used in an NMR spectrometer, an MRI apparatus or the like.

It is particularly noted that even when the target substance is poorly soluble in benzoic acid derivative, carbon 13 nuclear spins thereof can be hyperpolarized.

Though sodium carbonate aqueous solution is used for dissolving benzoic acid derivative powder in the foregoing, it is not limiting. By way of example, benzoic acid derivative powder may be dissolved by using an aqueous solution containing a molecule for pH adjustment or a molecule that causes weak acid dissociation such as alkali metal carbonate including lithium ions or potassium ions. Carbonates such as sodium carbonate, potassium carbonate and lithium carbonate, as the molecules that cause weak acid dissociation, dissolve benzoic acid by converting the benzoic acid to benzoate that is easily soluble to water by dissociating weak acid. The molecule for pH adjustment may include, for example, ammonia molecule. In that case, at step 326, it is possible to transfer polarization from hyperpolarized carbon 13 nuclear spins to lithium nuclear spins or potassium nuclear spins and, thus, an aqueous solution containing hyperpolarized lithium ions or potassium ions can be obtained.

Further, the target is not limited to pyruvic acid. Various substances such as molecule used as medicines, in-vivo molecules, sugar, a compound having an amino group and carboxylic acid compound having one or more carboxy groups may be used as the target. In-vivo molecule may be, for example, pyruvic acid or urea. These are not limiting, and any molecules synthesized, dissolved or processed in any manner within an organism including animal and human bodies may be used. The molecule used as a medicine may include, for example, caffeine and fluorouracil, though not limiting. Any molecule contained in chemicals used for diagnosis, treatment and prevention of human or animal diseases may be used. For example, it is possible to attain hyperpolarization by using fumaric acid (dicarboxylic acid), urea or fructose as a target. These are typical substances used in conventional Dissolution DNP method, of which hyperpolarization could not be attained by the conventional triplet DNP method using pentacene.

Further, it is possible to use a target containing atoms of non-zero nuclear spin. When such a target is used, after resolidification of aqueous solution (step 332) and before melting (step 328), cross-polarization irradiation is performed as at step 326. By setting the frequency of microwave to be irradiated to a resonance frequency in accordance with the target atoms of non-zero nuclear spin, it becomes possible to transfer polarization from hyperpolarized carbon 13 nuclear spins to nuclear spins included in the target. Thus, it becomes possible to hyperpolarize nuclear spins of any sample.

Though an example has been described in which benzoic acid derivative containing carbon 13 is used and polarization of hydrogen nuclear spins is transferred to carbon 13 nuclear spins at step 320 (cross-polarization irradiation) in the foregoing, it is not limiting. It may also be possible to omit the process at step 320, to maintain hydrogen nuclear spins hyperpolarized and to transfer polarization of hydrogen nuclear spins to sodium nuclear spins at step 326 (cross-polarization irradiation), or to transfer polarization of hydrogen nuclear spins to hydrogen nuclear spins of the target (for example, pyruvic acid) at step 332 (spin diffusion). In that case, benzoic acid derivative may not contain carbon 13. Further, it is also possible to use benzoic acid derivative that contains isotope of carbon, oxygen or nitrogen, of which nuclear spin is non-zero. For example, it is possible to use benzoic acid derivative containing oxygen 17 or nitrogen 15, and to transfer polarization of hydrogen nuclear spins to oxygen 17 or nitrogen 15 nuclear spins at step 320 (cross-polarization irradiation).

Though an example in which an aqueous solution containing benzoic acid derivative is cooled and solidified at step 324 or 332 has been described in the foregoing, it is not limiting. By way of example, a chemical method such as reprecipitation may be used for solidification. The solid substance obtained by reprecipitation may be liquefied by using a chemical method at step 328.

Third Embodiment

In the first embodiment, an example has been described in which monochromatic laser beam was irradiated and microwave was irradiated by using a waveguide and a cavity. In the third embodiment, these structures are modified to reduce the size of the apparatus.

Figure 13:
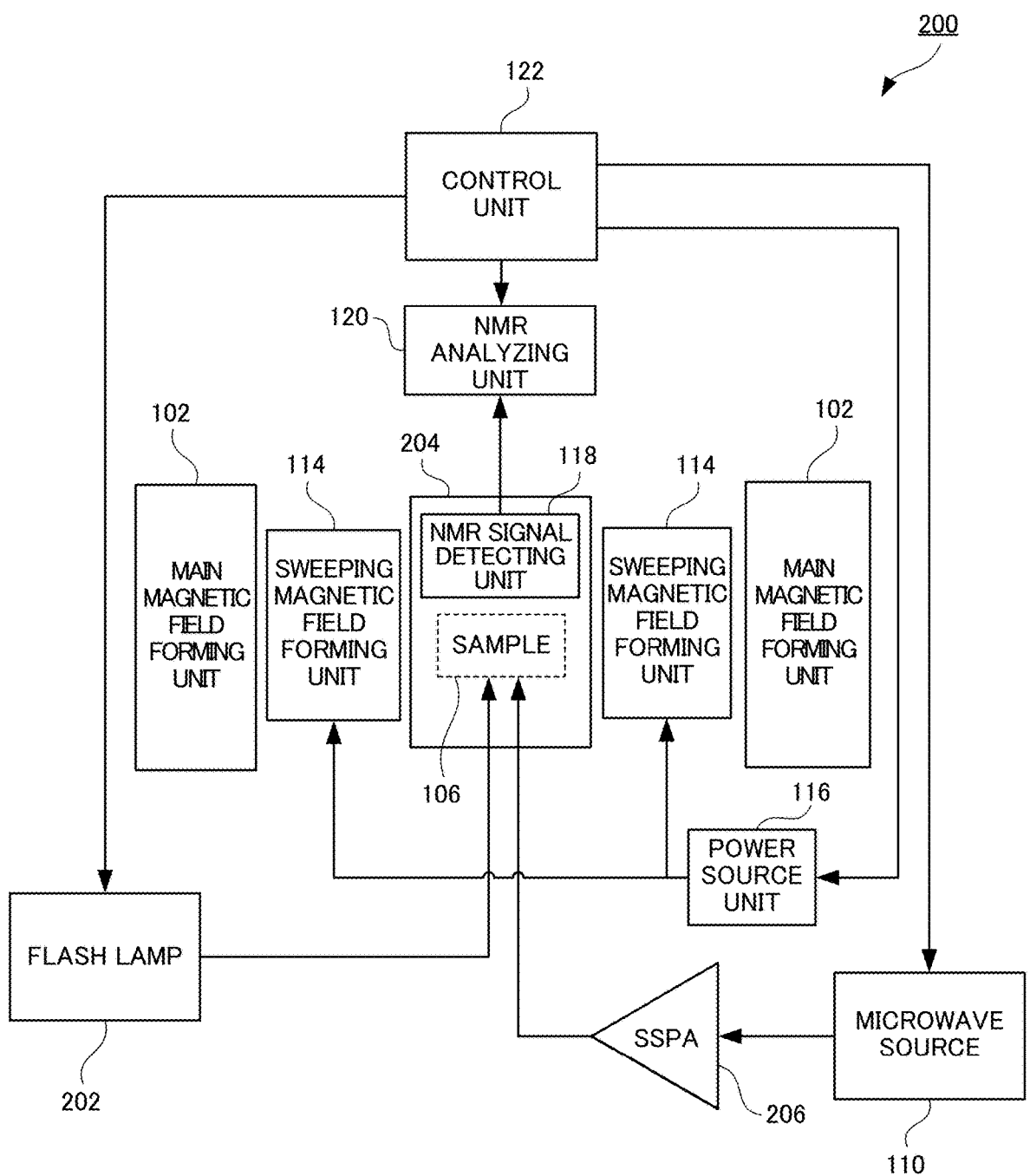
FIG. 13 is a block diagram showing a schematic structure of the nuclear spin hyperpolarization apparatus in accordance with a third embodiment of the present invention.

Referring to FIG. 13, a nuclear spin hyperpolarization apparatus 200 in accordance with the present embodiment has laser source 108, cavity 104 and amplifying unit 112 of the nuclear spin hyperpolarization apparatus 100 shown in FIG. 1 replaced by a flash lamp 202, a dielectric resonator 204 and an SSPA 206, respectively. A permanent magnet is used as main magnetic field forming unit 102.

Flash lamp 202 is a known flash lamp that emits light for a very short time period and, for example, a xenon flash lamp may be used. The light emitted from the flash lamp is not a coherent light such as the laser beam but non-coherent light, and its wavelength has a prescribed width. Dielectric resonator 204 is a known resonator using a dielectric. The cavity (cavity resonator) used in the nuclear spin hyperpolarization apparatus 100 shown in FIG. 1 is formed by metal walls and resonates as the electromagnetic waves are totally reflected by the metal walls. The dielectric resonator resonates as the electromagnetic waves in the dielectric are totally reflected at the interface between the dielectric and air. SSPA 206 is a high-output amplifier using a semiconductor, and it is a known Solid State Power Amplifier.

Though a dye laser is used in the nuclear spin hyperpolarization apparatus 100 shown in FIG. 1, it is confirmed that triplet DNP is possible with light other than the laser beam. Specifically, a triplet DNP experiment was conducted in which a flash lamp having light intensity of 100 mW at a converging portion was used with the pulse width of about 10 microseconds and repetition frequency of 60 Hz, and the same sample as used in Example 1 was irradiated by converged light in accordance with a pulse sequence shown in FIG. 5. As a result, the sample of 0.1 mg was successfully hyperpolarized to the level comparable to that attained by the dye laser.

Therefore, it is possible to attain hyperpolarization of electron spins of pentacene derivative with high efficiency using a very inexpensive and small light source such as a flash lamp, and hyperpolarization of nuclear spins of various substances including benzoic acid derivative doped with pentacene derivative is possible as described above in the first and second embodiments.

It is noted that unlike an optical pump, DNP is independent of selection rules of optical transition. Therefore, it is not sensitive to the spectrum of excited light. Actually, triplet DNP was conducted with the wavelength of dye leaser set to 570 nm, at which pentacene absorption efficiency is low, while other conditions of main magnetic field, the sweeping magnetic field and the like were set the same. The result shows that the finally attained nuclear spin polarization was almost the same as when the wavelength was set to 590 nm, at which pentacene absorption efficiency is the highest. In other words, it was confirmed that wavelength of low absorption efficiency was sufficient for triplet DNP. Pentacene can absorb light having the wavelength in the range of 400 nm to 600 nm, and a xenon flash lamp has one third of its total amount of light in this range. Therefore, a xenon flash lamp can be suitable for conducting triplet DNP. Though a flash lamp outputting light of the wavelength covering the entire range of 400 nm to 600 nm is preferable, a flash lamp that outputs light of which wavelength partially covers the range of 400 nm to 600 nm may be used for triplet DNP using pentacene.

Therefore, the light source for conducting triplet DNP on a sample doped with pentacene is not limited to a flash lamp. Any light source that emits non-coherent light of which wavelength is within the range of 400 nm to 600 nm and of which emission time is controllable in the order of about 1 μs may be used. Therefore various known light sources are available and a light source of smaller size can be adopted. By way of example, an LED may be used as the light source.

As regards the main magnetic field forming unit 102, a magnetic field of about 0.4 T can be realized by a permanent magnet by using a strong magnetic material such as rare-earth magnet. Use of a permanent magnet enables reduction in size.

By using dielectric resonator 204 as a resonator for containing sample 106, the resonator can be reduced in size. Thus, the space in which the main magnetic field is formed can be made smaller, and the distance between facing polar plates of magnet can be made narrower. The magnetic field strength sharply decreases with distance from the magnetic poles. Therefore, when the distance between facing magnetic poles can be made shorter, the strength of magnetic field formed in the area in between can be increased. Therefore, a smaller size magnet is sufficient if the magnetic field of the same strength is to be formed.

When a resonator not including an electric conductor is used as dielectric resonator 204, it is possible to place sweeping magnetic field forming unit 114 outside the dielectric resonator 204. When a resonator including an electric conductor (such as one having a metal plate on a part of the dielectric) is used as dielectric resonator 204, it is preferable to place sweeping magnetic field forming unit 114 inside the dielectric resonator 204 as in the example shown in FIG. 2.

When dielectric resonator 204 is used, it is possible to use a solid state power amplifier (SSPA) as an amplifier for amplifying the microwaves output from NMR signal detecting unit 118. A TWT amplifier uses an electron tube, while a solid state power amplifier uses a semiconductor and, hence, a solid state power amplifier is smaller than a TWT amplifier. By improving conversion efficiency of input electric power to magnetic field, it becomes possible to replace the microwave amplifier of TWT amplifier to a smaller solid state power amplifier.

Figure 3:
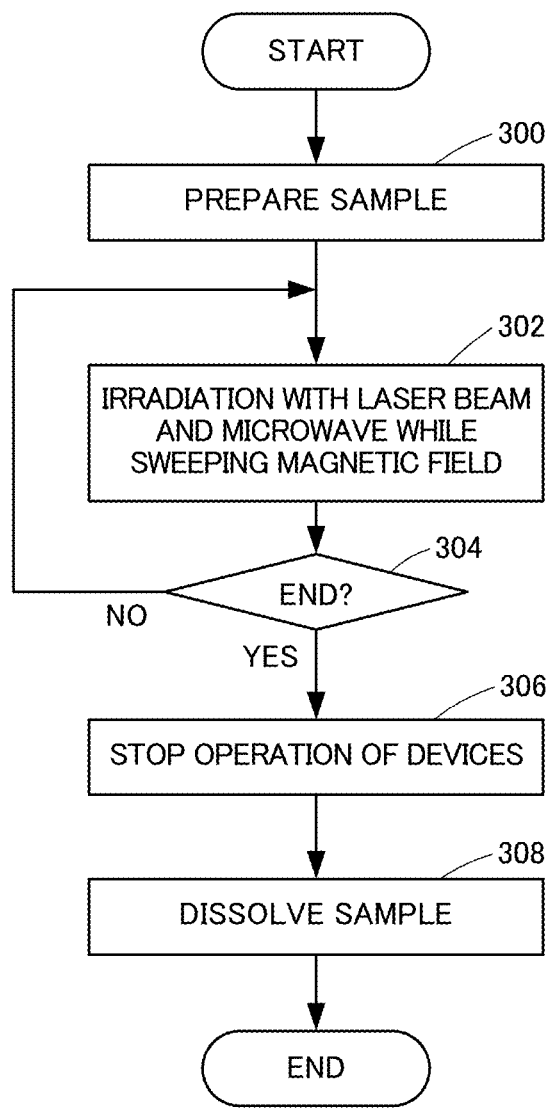
FIG. 3 is a flowchart representing a nuclear spin hyperpolarization method using the nuclear spin hyperpolarization apparatus shown in FIG. 1.

Using the nuclear spin hyperpolarization apparatus 200 shown in FIG. 13, it is possible to carry out the nuclear spin hyperpolarization method by triplet DNP in the same manner as shown in FIGS. 3 and 11. Specific contents are the same as those described as the first and second embodiments and, therefore, description thereof will not be repeated.

Though an example using a dielectric resonator has been described in the foregoing, it is not limiting. Any resonator smaller in size than a cavity resonator may be used, and by using such a resonator, the distance between facing magnetic poles can be made shorter. By way of example, a known loop gap resonator may be used.

The embodiments as have been described here are mere examples and should not be interpreted as restrictive. The scope of the present invention is determined by each of the claims with appropriate consideration of the written description of the embodiments and embraces modifications within the meaning of, and equivalent to, the languages in the claims.

INDUSTRIAL APPLICABILITY

By the present invention, it is possible to generate an aqueous solution containing benzoic acid derivative with hyperpolarized nuclear spins in room temperature environment without necessitating cooling of a sample. Using the aqueous solution containing benzoic acid derivative with hyperpolarized nuclear spins in an NMR spectrometer or in an MRI apparatus, ultrasensitive chemical analysis or ultrasensitive metabolism imaging becomes possible.

REFERENCE SIGNS LIST 100, 200 nuclear spin hyperpolarization apparatus
102 main magnetic field forming unit
104 cavity
106 sample
108 laser source
110 microwave source
112 amplifying unit
114 sweeping magnetic field forming unit
116 power source unit
118 NMR signal detecting unit
120 NMR analyzing unit
122 control unit
130 light transmitting unit
132 light converging unit
134 waveguide
136 sample container unit 138 solvent supplying unit
150 solvent
152 aqueous solution
154 liquid nitrogen
156 heater
202 flash lamp
204 dielectric resonator
206 SSPA

The invention claimed is:

1. A nuclear spin hyperpolarization method, comprising:
a light irradiation step of irradiating a sample, placed in a space where a uniform static magnetic field is formed, with light; and
a microwave irradiation step, following said light irradiation step, of irradiating said sample with a microwave while applying a sweeping magnetic field on said sample; wherein
said sample is a solid state benzoic acid derivative doped with a pentacene derivative;
said method further comprising
a dissolving step, conducted after repeating said light irradiation step and said microwave irradiation step, of dissolving the benzoic acid derivative in said sample to generate a solution.

2. The nuclear spin hyperpolarization method according to claim 1, wherein
said sample is further doped with a soluble substance soluble in benzoic acid derivative; and
at said dissolving step, the benzoic acid derivative and said soluble substance in said sample are dissolved.

3. The nuclear spin hyperpolarization method according to claim 1, wherein at least one substance other than the pentacene derivative in said sample contains at least one of carbon, oxygen and nitrogen isotopes of non-zero nuclear spin.

4. The nuclear spin hyperpolarization method according to claim 3, further comprising
a nuclear spin polarization step, conducted after repeating said light irradiation step and said microwave irradiation step and before conducting said dissolving step, of transferring polarization of hydrogen nuclear spins of the substance other than the pentacene derivative in said sample to nuclear spins of said isotope by cross-polarization.

5. The nuclear spin hyperpolarization method according to claim 1, wherein at said dissolving step, a substance other than the pentacene derivative in said sample is dissolved by an aqueous solution of a molecule causing weak acid dissociation or a pH adjusting molecule, to generate said solution.

6. The nuclear spin hyperpolarization method according to claim 5, further comprising:
a resolidification step of solidifying said solution to generate a solid substance;
a nuclear spin transferring step of transferring nuclear spin polarization of benzoic acid derivative in said solid substance to nuclear spins of said molecule causing weak acid dissociation or of said pH adjusting molecule by cross-polarization; and
a liquefying step, conducted after said nuclear spin transferring step, of liquefying said solid substance.

7. The nuclear spin hyperpolarization method according to claim 1, further comprising:
a step of dissolving an object substance as an object of which nuclear spins are to be hyperpolarized, in the solution generated at said dissolving step;
a resolidification step of solidifying the solution to which said object substance is dissolved, to generate a solid substance;
a target nuclear spin polarization step of transferring nuclear spin polarization of the benzoic acid derivative in said solid substance to nuclear spins of said object substance by spin diffusion; and
a liquefying step, conducted after said target nuclear spin polarization step, of liquefying said solid substance.

8. The nuclear spin hyperpolarization method according to claim 7, wherein
at said resolidification step, the solution to which said object substance is dissolved is frozen to generate said solid substance; and
at said liquefying step, said frozen solid substance is heated to be liquefied.

9. The nuclear spin hyperpolarization method according to claim 7, wherein said object substance is a carboxylic acid compound, a compound having an amino group, sugar, an in vivo molecule or a molecule used as a medicine.

10. An nuclear spin hyperpolarization method, comprising:
a light irradiation step of irradiating a sample, placed in a space where a uniform static magnetic field is formed, with light; and
a microwave irradiation step, following said light irradiation step, of irradiating said sample with a microwave while applying a sweeping magnetic field on said sample; wherein
said sample is a mixture of benzoic acid derivative and a partner molecule other than the benzoic acid derivative, doped with a pentacene derivative;
said method further comprising
a dissolving step, conducted after repeating said light irradiation step and said microwave irradiation step, of dissolving the benzoic acid derivative and the partner molecule in said sample to generate a solution.

11. The nuclear spin hyperpolarization method according to claim 10, wherein
said partner molecule is a carboxylic acid other than benzoic acid derivative, or a base forming a salt with the benzoic acid derivative; and
said mixture is a cocrystalline or eutectic polycrystal sample or an amorphous sample.

12. The nuclear spin hyperpolarization method according to claim 10, wherein
said sample is further doped with a soluble substance soluble in said mixture; and
at said dissolving step, the benzoic acid derivative, the partner molecule and the soluble substance in said sample are dissolved.

13. An apparatus for nuclear spin hyperpolarization in a sample by triplet DNP, comprising:
a magnetic field forming unit forming a static magnetic field;
a light irradiation unit irradiating said sample, placed in a space where said static magnetic field is formed, with light;
a microwave irradiation unit irradiating said sample, placed in the space where said static magnetic field is formed, with a microwave pulse; and
a control unit controlling said light irradiation unit and said microwave irradiation unit; wherein
said control unit controls said light irradiation unit and said microwave irradiation unit such that nuclear spins in said sample are hyperpolarized by triplet DNP; and said light irradiation unit outputs non-coherent light of which wavelength is in a range of 400 nm to 600 nm.

14. The apparatus for nuclear spin hyperpolarization according to claim 13, wherein said microwave irradiation unit includes a solid state power amplifier and a resonator different from a cavity resonator, placed in the space where said static magnetic field is formed;

said light irradiation unit irradiates said sample placed in said resonator with light; and said microwave irradiation unit irradiates said sample placed in said resonator with microwave pulses amplified by said solid state power amplifier.

15. The apparatus for nuclear spin hyperpolarization according to claim 14, wherein said resonator is a dielectric resonator or a loop gap resonator.

* * * * *